United States Patent
Nishikawa et al.

(10) Patent No.: US 7,273,647 B2
(45) Date of Patent: Sep. 25, 2007

(54) SILICON ANNEALED WAFER AND SILICON EPITAXIAL WAFER

(75) Inventors: Hideshi Nishikawa, Tokyo (JP);
Nobumitsu Takase, Tokyo (JP);
Kazuyuki Egashira, Tokyo (JP);
Hiroshi Hayakawa, Tokyo (JP)

(73) Assignee: Sumitomo Mitsubishi Silicon Corporation, Tokyo (JP)

( * ) Notice: Subject to any disclaimer, the term of this patent is extended or adjusted under 35 U.S.C. 154(b) by 418 days.

(21) Appl. No.: 10/809,712

(22) Filed: Mar. 26, 2004

(65) Prior Publication Data

US 2004/0194692 A1    Oct. 7, 2004

(30) Foreign Application Priority Data

Apr. 1, 2003  (JP) .............................. 2003-097665

(51) Int. Cl.
B32B 9/04 (2006.01)
(52) U.S. Cl. .................. 428/64.1; 428/446; 117/928; 423/348
(58) Field of Classification Search ...................... None
See application file for complete search history.

(56) References Cited

U.S. PATENT DOCUMENTS 6,261,361 B1 *  7/2001  Iida et al. ........................ 117/19
6,413,310 B1 *  7/2002  Tamatsuka et al. ............. 117/3
6,573,159 B1 *  6/2003  Kobayashi et al. ......... 438/471

FOREIGN PATENT DOCUMENTS

| JP | 10-098047 | 4/1998 |
|---|---|---|
| JP | 11-189493 | 7/1999 |
| JP | 2001-199795 | 7/2001 |
| JP | 2002-187794 | 7/2002 |

* cited by examiner

*Primary Examiner*—Jennifer McNeil
*Assistant Examiner*—Timothy M. Speer
(74) *Attorney, Agent, or Firm*—Clark & Brody

(57) ABSTRACT

A silicon annealed wafer having a sufficient thick layer free from COP defects on the surface, and a sufficient uniform BMD density in the inside can be produced by annealing either a base material wafer having nitrogen at a concentration of less than $1 \times 10^{14}$ atoms/cm$^3$, COP defects having a size of 0.1 μm or less in the highest frequency of occurrence and no COP defects having a size of 0.2 μm or more, oxygen precipitates at a density of $1 \times 10^4$ counts/cm$^2$ or more, and BMDs (oxygen precipitates), where the ratio of the maximum to the minimum of the BMD density in the radial direction of the wafer is 3 or less, or a base material wafer grown at specific average temperature gradients within specific temperature ranges and specific cooling times for a single crystal at a nitrogen concentration of less than $1 \times 10^{14}$ atoms/cm$^3$, employing the Czochralski method. Moreover, a silicon epitaxial wafer having very small defects and a uniform BMD distribution in the inside can be formed by growing an epitaxial layer on the surface of either the first type base material wafer or the second type base material wafer. Both the silicon annealed wafer and the silicon epitaxial wafer greatly reduce the rate of producing defective devices, thereby enabling the device productivity to be enhanced.

7 Claims, 3 Drawing Sheets

Distance from the Wafer Center (mm)

SILICON ANNEALED WAFER AND SILICON EPITAXIAL WAFER

BACKGROUND OF THE INVENTION

1. Field of the Invention

The present invention relates to a silicon annealed wafer having a defect free layer on the surface, which wafer is used for producing semiconductor devices, and also to a silicon epitaxial wafer with a perfect epitaxial layer.

2. Description of the Related Art

A silicon wafer used for producing semiconductor devices is produced by slicing a silicon single crystal grown mainly by the Czochralski method. In the Czochralski method, a silicon single crystal is grown from molten silicon in a quartz crucible, pulling up a seed crystal to solidify the molten silicon.

Normally, oxygen solves into the molten silicon from the raw silicon material and/or the quartz crucible, and the solved oxygen is retained in the single crystal during the silicon solidification. The solubility of oxygen is decreased by the decrease in the temperature of the single crystal, and therefore the single crystal contains oxygen in a saturated state. As a result, oxygen precipitates are generated in the wafer during a heat treatment in the process of manufacturing devices.

Such oxide precipitates or defects induced from the precipitation is called BMD (Bulk Micro Defect). The existence of such BMDs in the surface region of the wafer, on which devices are formed, i.e., on an active region, causes the deterioration of the device characteristics. On the contrary, BMDs existing in a region other than the active region in a substrate suppresses the contamination of the active region into which metal impurities diffuse during the process of manufacturing devices, so that BMD serves as a gettering site for capturing such metal impurities.

In order to effectively use the gettering effect of BMD, a DZ-IG (Denuded Zone-Intrinsic Gettering) treatment is employed. In the DZ-IG treatment, a wafer is subjected to a heat cycle in which the wafer is heated at approximately 1150° C. in an atmosphere containing nitrogen, oxygen or mixture of both, and then annealed at 500° C.-900° C. for several hours or more. Such a heat treatment at a high temperature allows oxygen in the vicinity of the wafer surface to be diffused to the outside thereof. Accordingly, a denuded zone (DZ) having a low oxygen concentration can be formed in the surface layer where neither oxygen precipitates nor defects resulting therefrom reside. Furthermore, the subsequent heat treatment at a lower temperature forms BMDs having the gettering effect in the wafer.

By such DZ-IG treatment, it is possible to obtain a high quality wafer, from which devices having excellent properties can be produced at high yields. However, long process times for the heat treatment and a large variation in the effect of the treatment result in an increase of the production cost.

In most cases, moreover, COP (Crystal Originated Particle) defects (which are called IR-light scattering tomography defects when they exist in the wafer), which pertain to a type of grown-in defects formed in the course of growing a single crystal, reside in the wafer, and it is not possible to remove such COP defects from the wafer by the DZ-IG treatment. The COP defects have a particle size of 0.1 μm or so and they exist in a single crystal at a density of $10^5$-$10^6$ counts/cm$^3$ or so. A main factor of deteriorating the device characteristics results from the COP defects in the current process of manufacturing semiconductor devices.

In order to reduce the number of COP defects, a wafer is heated at a high temperature of 1200° C. or so in a non-oxidizing atmosphere containing hydrogen, argon or the like. In this method, a heat treatment at a high temperature is applied to the wafer so as to reduce the density of COP defects in the surface layer of the wafer as well as to diffuse oxygen to the outside thereof. Accordingly, such a heat treatment at a high temperature makes it possible to easily manufacture a high quality wafer including neither oxygen precipitates nor COP defects at the device active region in the surface layer of the wafer.

For instance, Japanese Patent Application Publication No. 10-98047 discloses a technology, in which a wafer is annealed at 1000° C. or more for one hour or more in an atmosphere containing a rare gas or a gas which is selectable from a group of oxygen, nitrogen, a mixture of oxygen and nitrogen, and hydrogen.

In this case, a single crystal, from which wafers are prepared, is produced either under conditions that the oxygen concentration is $4 \times 10^{17}$ atoms/cm$^3$ or more and it is maintained within a temperature range of 850-1100° C. for less than 80 minutes during the cooling period for the single crystal growth, or under the condition that it has the nitrogen concentration of at least $1 \times 10^{14}$ atoms/cm$^3$. An increased cooling rate within the above temperature range during the single crystal growth causes the size of the COP defects to be decreased, and thereby the density of the defects resulting from the annealing can be effectively reduced.

In the above Japanese Patent Application Publication No. 10-98047, it is shown that a defect free layer can easily be formed on the surface of a wafer. However, no description is given regarding the BMD providing the gettering effect within the wafer. While it has been already known that the doping of nitrogen causes strengthening a silicon crystal, the doped nitrogen influences the generation not only of grown-in defects, but also of OSFs (Oxidation Induced Stacking Faults) or the like resulting from oxygen precipitation or the heat treatment for high temperature oxidation.

In a technical literature (K. Nakai: "Nitrogen and Carbon Effect on the Formation of Grown-in Defects and Oxygen Precipitation Behavior", The 52th Conference of Japanese Association for Crystal Growth, Bulk Growth Section Meeting, Feb. 8, 2000, pp. 6-9), it is shown that the nitrogen concentration strongly influences the oxygen precipitation. In the case of a single crystal wafer having a diameter of 200 mm, with the same oxygen concentration, an annular potential region of OSF occurrence is formed in a peripheral section of a 50 mm radial width at a doped nitrogen concentration of $5 \times 10^{14}$ atoms/cm$^3$, and OSFs are formed over the entire surface area of the wafer at a doped nitrogen concentration of $3 \times 10^{15}$ atoms/cm$^3$.

In Japanese Patent Application Publication No. 11-189493, a technology of enhancing the gettering effect for an epitaxial wafer is disclosed. In the technology disclosed therein, the formation of an epitaxial layer on a potential region of OSF occurrence on the surface of a wafer makes it impossible to eliminate oxygen precipitate nuclei even at a high temperature during the epitaxial layer formation, and therefore the nuclei serve as an effective gettering site.

Moreover, Japanese Patent Application Publication No. 11-189493 also describes that nitrogen doping at a concentration of $1 \times 10^{13}$ atoms/cm$^3$ or more is normally effective for expanding the width of the annular potential region of OSF occurrence with respect to the center of the wafer, i.e., the axis of pulling the single crystal, to expand the region over the entire wafer.

Furthermore, Japanese Patent Application Publication No. 2001-199795 describes a manufacturing method, wherein, when the passing period through a temperature range of 1100° C. to 700° C. is set to within 200 minutes or less in the process of growing a single crystal at a doped nitrogen concentration of $1 \times 10^{13}$-$1.2 \times 10^{15}$ atoms/cm$^3$, heterogeneity of the BMD density within the wafer resulting from the OSF ring can be eliminated.

As described above, regarding an annealed wafer free from such defects as oxygen precipitates and COPs in the device active region of the wafer surface layer, and which has BMD gettering sites in the inside, various methods have been proposed for decreasing the size of the COP defects by nitrogen dope, so small as to be eliminated by the annealing and at the same time for destributing BMDs sufficiently and uniformly.

However, due to the high segregation coefficient of nitrogen, it is difficult to distribute nitrogen concentration uniformly over the entire single crystal to be grown. Consequently, if it is necessary to dope nitrogen in the single crystal at a high concentration, the crystal area at such high concentration is restricted and no satisfactory yield can be obtained, thereby making it difficult to apply this method to the practical usage.

SUMMARY OF THE INVENTION

In order to solve the above problems, the object of the present invention is to provide a silicon annealed wafer having a defect free layer at the surface and a sufficiently greater number of BMDs in an uniform distribution inside the wafer as well as to provide a silicon expitaxial wafer, with a perfect epitaxial layer.

In order to attain the above object, the present inventors extensively studied the method for manufacturing a silicon wafer, wherein either a base material wafer is annealed at a high temperature under a rare gas such as hydrogen gas, argon gas or the like, or a mixture thereof to form a defect free layer on the surface, or even after an epitaxial layer was formed on the surface of a base material wafer, BMDs having the gettering effect were uniformly distributed at a sufficient amount inside the base wafer.

From the results of the annealing process applied for various wafers, it was verified that COP defects can be eliminated in the surface layer even if many defects are included, so long as the size of the defects in the surface layer is mostly small and there is no defect having a large size.

The effect of doping nitrogen was studied since nitrogen has effect to make the size of COP defects miniaturized, and it was recognized that the doping allowed the size of the COP defects to be miniaturized under the normal pulling conditions of the single crystal.

However, it is shown that the annular potential region of OSF occurrence expands toward the center of the wafer and that the radial width of the OSF ring tends to expand with the increase of the amount of doped nitrogen. BMDs having the gettering effect can be regarded as oxygen precipitates, each of which is a stable nucleus of occurring OSFs at a high temperature. Accordingly, the BMD distribution state is varied in accordance with a change in the distribution of the potential region of OSF occurrence. However, the annealing process does not largely alter the distribution although the number of BMDs is varied.

The expansion of the annular potential region of OSF occurrence toward the center of the wafer causes the density of BMDs to be altered in the distribution on the surface of the wafer, so that the difference between the maximum and minimum of the BMD density is increased and therefore the uneven distribution becomes nonuniformer. A further increased amount of doped nitrogen causes the OSF density to be increased, thereby distribution becoming uniform over the entire surface area of the wafer.

A doped nitrogen concentration of more than $10^{15}$ atoms/cm$^3$ is required to homogenize the nonuniform distribution in the OSF and/or BMD density. However, such a doped nitrogen concentration is very close to the solubility limit of nitrogen in a silicon single crystal, and therefore it is difficult to maintain such a high nitrogen concentration over the whole length of the single crystal.

The border line of the annular potential region of OSF occurrence, which is observable on the wafer, moves toward the outer periphery of the wafer, when the pulling rate of the single crystal is increased, whereas it moves toward the center of the wafer, when the pulling rate of the single crystal is decreased.

In order to avoid the effect of OSFs, the growth of a single crystal is traditionally performed under conditions that the annular OSF area is positioned in the vicinity of the outer periphery and that the COP defects as one type of the grown-in defects are mainly formed in the inside thereof. This is due to the fact that the COP defects provide a relatively small effect on the deterioration of the device characteristics defect and a single crystal can be grown at a higher speed.

On the other hand, the recent technology on the high density and high precision fabrication of integrated circuits requires reducing the number of COP defects as few as possible. In view of this fact, various methods for growing a single crystal have been proposed, wherein a defect free area is extended by expanding the area at which grown-in defects rarely occur in the vicinity of the annular potential region of OSF occurrence.

One of the methods for growing a single crystal is disclosed in Japanese Patent Application Publication No.2002-187794. In this method, the single crystal is grown by the Czochralski method, pulling a single crystal from molten silicon at a temperature range from the melting point to 1370° C. under the following conditions: The temperature gradient Gc in the axial direction at the center of the single crystal and the temperature gradient Ge in the axial direction at the periphery of the single crystal are set such that Gc is 2.8 or more and that Gc/Ge is 1 or more.

Such a temperature distribution inside the single crystal, where the temperature gradient at the center of the crystal is greater than that of the outer periphery just after the solidification, can be realized by adjusting the structure of the cooling zone just after pulling (hot zone), i.e., the relative position between a crucible and a heater; the shape of a heat-shield material; the distance between the heat-shield material and the surface of the molten silicon; the distance between the heat-shield material and the surface of the single crystal; the distance between a cooling member and the surface of the single crystal; and others.

A wafer including very few grown-in defects over the entire surface can be grown, if the single crystal is grown such that a COP defect region resides inside of the wafer and a few potential regions of OSF occurrence remain in the outer periphery.

If, however, such a wafer is subjected to a heat treatment for forming oxygen precipitates, sufficiently many BMDs are formed. However, it is found that BMDs are not always formed in a stable state by heat treatment for the annealing.

It is assumed that the growth of a single crystal to produce the above condition, using the cooling zone structure, provides a more homogeneous distribution in the oxygen concentration and/or the COP defects.

In view of the above fact, an investigation was made on the method for manufacturing a single crystal, mainly used for the annealed wafer, using an apparatus capable of realizing such a temperature distribution in the crystal growth process by pulling up the single crystal, as disclosed in Japanese Patent Application Publication No. 2002-187794.

It is generally known that an increase in the pulling rate decreases the size of the COP defects, and that a further annealing makes it possible to eliminate the COP defects, so long as the size of most defects are small and there is no defect having a large size.

In fact, it was found that an increase in the pulling rate with the above-mentioned growth apparatus increases the number of the COP defects, along with a decrease in the size of the COP defects.

Since it was assumed that the application of the annealing could not completely eliminate the COP defects in the surface layer, a further investigation was made on the effect of nitrogen doping on the COP defects, and it was found that a relatively small doping amount made it possible to decrease the size of COP defects down to a size in which the defects could be eliminated. In this case, however, an increase in the doping amount of nitrogen provided ununiform distribution of the defect density in the wafer.

The fact that the crystal growth apparatus including the above-mentioned improved hot zone allows the annular potential region of OSF occurrence to be moved toward a more outer radial position. The above result is from a duplicated condition where an increased pulling rate decreases the size of COP defects, and increase in the doping amount of nitrogen increases the number of COP defects.

In other words, the annular potential region of OSF occurrence resides in the vicinity of the outer periphery or outside with smaller doping amounts of nitrogen, whereas the border of the annular potential region of OSF occurrence moves toward the center of the wafer at an increased doping amount of nitrogen. Accordingly, the doping amount of nitrogen has to be limited to an appropriate value.

Using an apparatus having an improved hot zone so as to guarantee that the temperature gradient ratio Gc/Ge is set at 1.12 within a temperature range from the solidification temperature to 1300° C., nitrogen doped single crystals were grown at an oxygen concentration of $15 \times 10^{17}$-$17 \times 10^{17}$ atoms/cm$^3$.

FIG. 1 is a diagram showing the relationship between the concentration of doped nitrogen and the maximum OSF density in a wafer. A close examination of the density reveals that the OSF area moves toward the center of the wafer at an increased concentration of nitrogen and the maximum OSF density abruptly increases at a nitrogen concentration of more than a certain value, as shown in FIG. 1.

A wafer having an increased OSF density provides a large difference between the maximum and minimum BMD density, along with an increased variation in the density across the wafer. Accordingly, a restricted amount of doped nitrogen is required to obtain a homogenous BMD density distribution.

Hence, it is found that, when nitrogen is doped at a restricted concentration, using a growth apparatus having such an improved temperature distribution in the hot zone, the size of COP defects is decreased and the BMD density distribution is also homogenized.

A detailed investigation was further made regarding the relationship between the conditions of growing a single crystal, such as the pulling rate of a single crystal, the temperature distribution of the hot zone, the nitrogen concentration, and others and the status of COP defects occurrence and/or the BMD density. The result of investigation reveals that a pass time within a temperature range from 1200° C. to 1000° C. and a pass time within a temperature from 1030° C. to 920° C. also provide a strong influence on the status of COP defects occurrence and the BMD density.

A decreased pass time between 1200° C. and 1000° C. allows the size of COP defects to be decreased, and further the occurrence of large COP defects to be suppressed. Since COP defects are formed due to the supersaturation of vacancies in a single crystal, it may be assumed that the decreased pass time in such a temperature range causes the growth of COP defects to be suppressed.

Moreover, a decreased pass time between 1030° C. and 920° C. allows the homogenization in the BMD distribution to be improved. It may be assumed that the occurrence of OSF nuclei starts within such a temperature range, so that the suppression of the OSF nucleus occurrence allows the homogenization of BMD distribution to be promoted.

As described above, using a pulling apparatus providing an improved temperature distribution at a high temperature just after pulling the single crystal in the growth of a single crystal, a small amount of doped nitrogen and a further shortened pass time within the low temperature range make it possible to obtain a wafer including small size COP defects and uniformly distributed BMDs.

It was expected that the above-mentioned wafer would be quite useful as a substrate for an epitaxial wafer. As for the epitaxial wafer, normally a base material for the substrate is inserted into a reaction furnace after polishing the surface thereof, and heated at a high temperature, in which case, a gas containing a material including Si, such as SiHCl$_3$, is introduced into the furnace, together with a carrier gas, such as hydrogen, so that a high purity single crystal thin layer free from defects, that is, an epitaxial layer can be formed on the surface of the wafer by the thermal decomposition. In this case, numerous stacking faults occasionally occur due to the defects on the surface of the substrate.

The annealing process is performed at a temperature of 1100° C. to 1250° C. Such a temperature range is the same as that at which an expitaxial layer is grown. It would be presumed that if the heating at such temperature allows the COP defects to be eliminated from the surface, the occurrence of defects on the epitaxial layer would be suppressed. Moreover, it is desirable that BMDs reside inside the substrate in a sufficiently uniform distribution, as similarly to the other wafers. The BMD distribution can also be improved in the wafer processed in the above method.

In view of these facts, epitaxial wafers are produced from wafers prepared under different growth conditions. It is found that the defects in the expitaxial layer are formed in the outer periphery of the wafer, which is produced by doping nitrogen under the normal conditions.

The area corresponds to a region where numerous OSFs are found in a wafer before the process of growing the epitaxial layer is applied thereto. In this case, it is found that the variation in the density of BMDs formed in the epitaxial wafer becomes particularly large.

On the other hand, the base material wafer, from which the above-mentioned preferable annealed wafer can be obtained, provides an excellent expitaxial wafer having a few defects and a uniform BMD distribution.

On the basis of the above experimental results, the present invention may be completed by further confirming the limitation in the conditions, under which an effect further becomes prominent. The above-mentioned object can be accomplished by the following measures:

(1) A silicon annealed wafer, on the surface of which a COP defect free layer having a thickness of 5 μm or more is formed by annealing a base material wafer, is provided, wherein the base material wafer includes: a COP defect region from a single crystal containing a nitrogen concentration of less than $1 \times 10^{14}$ atoms/cm$^3$, wherein the COP defect has a size of 0.1 μm or less in the highest frequency of occurrence and there exist no COP defects having a size of more than 0.2 μm; oxygen precipitates formed at a density of $1 \times 10^4$ counts/cm$^2$ or more when the base material wafer is subjected to an oxygen precipitate evaluation heat treatment; wherein the ratio of the maximum to the minimum of BMD (oxygen precipitate) density is 3 or less in the radial direction of said base material wafer.

(2) A silicon annealed wafer, on the surface of which a COP defect free layer having a thickness of 5 μm or more is formed by annealing a base material wafer, is provided, wherein the base material wafer contains nitrogen at a concentration of less than $1 \times 10^{14}$ atoms/cm$^3$, and the base material wafer is grown by the Czochralski method under the following conditions: the temperature gradient ratio Gc/Ge is 1.0-1.5 where Gc (° C./mm) and Ge (° C./mm) are average temperature gradients in the axial direction of pulling at a temperature range from 1370° C. to 1310° C. for the center and the outer periphery of said base material wafer, respectively; the cooling time from 1200° C. to 1000° C. is within 50 min; and the cooling time from 1030° C. to 920° C. is within 30 min.

(3) A silicon epitaxial wafer is produced by forming an epitaxial layer on the surface of a base material wafer, wherein the base material wafer includes: a COP defect region of a single crystal containing nitrogen at a concentration of less than $1 \times 10^{14}$ atoms/cm$^3$, wherein the COP defect has a size of 0.1 μm or less in the highest frequency of occurrence and there exist no COP defects having a size of more than 0.2 μm; oxygen precipitates formed at a density of $1 \times 10^4$ counts/cm$^2$ when the base material wafer is subjected to an oxygen precipitate evaluation heat treatment; wherein the ratio of the maximum to the minimum of BMD (oxygen precipitate) density is 3 or less in the radial direction of said base material wafer.

(4) A silicon epitaxial wafer is produced by forming an epitaxial layer on the surface of a base material wafer, wherein the base material wafer contains nitrogen at a concentration of less than $1 \times 10^{14}$ atoms/cm$^3$, and the base material wafer is grown by the Czochralski method under the following conditions: the temperature gradient ratio Gc/Ge is 1.0-1.5 where Gc (° C./mm) and Ge (° C./mm) are average temperature gradients in the axial direction of pulling at a temperature range from 1370° C. to 1310° C. for the center and the outer periphery of said base material wafer, respectively; the cooling time from 1200° C. to 1000° C. is within 50 min; and cooling time from 1030° C. to 920° C. is within 30 min.

(5) It is preferable for the silicon annealed wafer according to the above (1) and (2) that the annealing process is performed at 1100° C.-1250° C. for 1-4 hours in a hydrogen gas, argon gas, helium gas or a mixed gas thereof.

Futhermore, it is preferable that the oxygen concentration of the base material wafer is $11 \times 10^{17}$-$17 \times 10^{17}$ atoms/cm$^3$ (ASTM F-121, 1979) and the COP defect region extends over an 80% or more surface area of the base material wafer in the radial direction.

Further objects, features and advantages of the present invention will become apparent from the following description with reference with the accompanying drawings and tables.

DESCRIPTION OF THE PREFERRED EMBODIMENTS

Referring now to the accompanying drawings and tables, the present invention will be described.

In the embodiments of the invention, it is assumed that silicon wafers according to the invention have a doped nitrogen concentration of less than $1 \times 10^{14}$ atoms/cm$^3$ in the stage of growing a single crystal as a base material. This is due to the fact that a small amount of doped nitrogen provides a decreased size in the COP defects, in particular the size of defects in the highest frequency of occurrence is reduced and the maximum size is also reduced.

Moreover, the BMD occurrence amount reduction by the annealing process will be minimized. The above effect can be discerned, even if the nitrogen concentration is reduced as well as even if the doping concentration is varied to some extent. However, it is preferable that the nitrogen concentration is $0.1 \times 10^{14}$ atoms/cm$^3$ or more.

Figure 1:
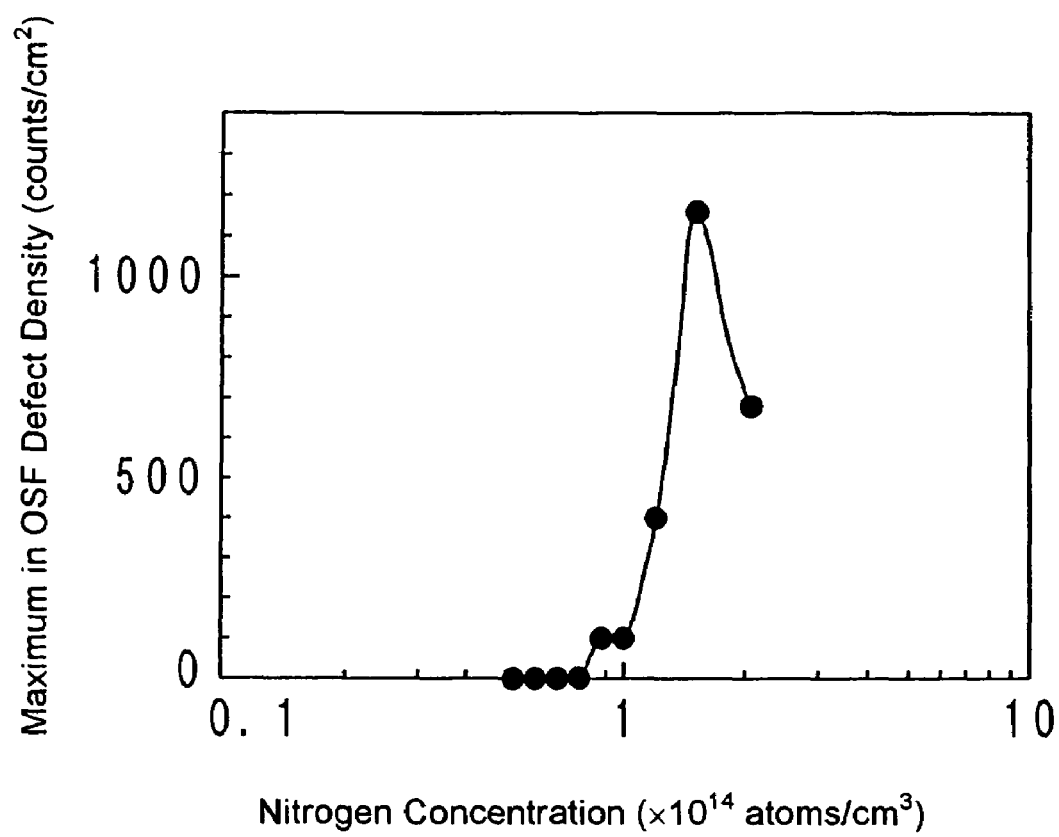
FIG. 1 is a diagram representing the relationship between the concentration of doped nitrogen and the maximum OSF density in a wafer.

As is already shown in FIG. 1, the OSF density increases at a nitrogen concentration of $1 \times 10^{14}$ atoms/cm$^3$ or more, along with an increased variation in the BMD density distribution across the wafer.

No special limitation is given as for the oxygen concentration. However, it is preferable that the oxygen concentration ranges from $11 \times 10^{17}$ to $17 \times 10^{17}$ atoms/cm$^3$ (ASTM F-121, 1979). This is due to the fact that the number of BMDs, which provide the gettering effect, becomes insufficiently small at a reduced oxygen concentration, whereas the nonuniformity in the BMD density across the wafer is increased at an increased oxygen concentration and the stacking faults also protrude even into the epitaxial layer in the case of an epitaxial wafer.

Moreover, it is preferable that the COP defect region occurring inside an annular OSF region extends over an 80% or more in the radial direction. This is due to the fact that, although the COP defects can be eliminated by the annealing, the other defects, for instance, dislocations cluster defects cannot be eliminated by such a heat treatment.

In this case, it is assumed that the COP defect size in the highest frequency of occurrence is 0.1 μm or less and there are no defects having a size of more than 0.2 μm. This is due to the fact that when the defect size in the highest frequency of occurrence is more than 0.1 μm, the defects cannot be completely eliminated by the annealing, and the defects having a size of more than 0.2 μm remain in the form of void or the like.

The size and the distribution density of COP defects were measured on the polished surface of each wafer, utilizing an OPP device (Oxygen Precipitate Profiler, manufactured by Accent Optical Technologies Co., Ltd.).

Figure 2:
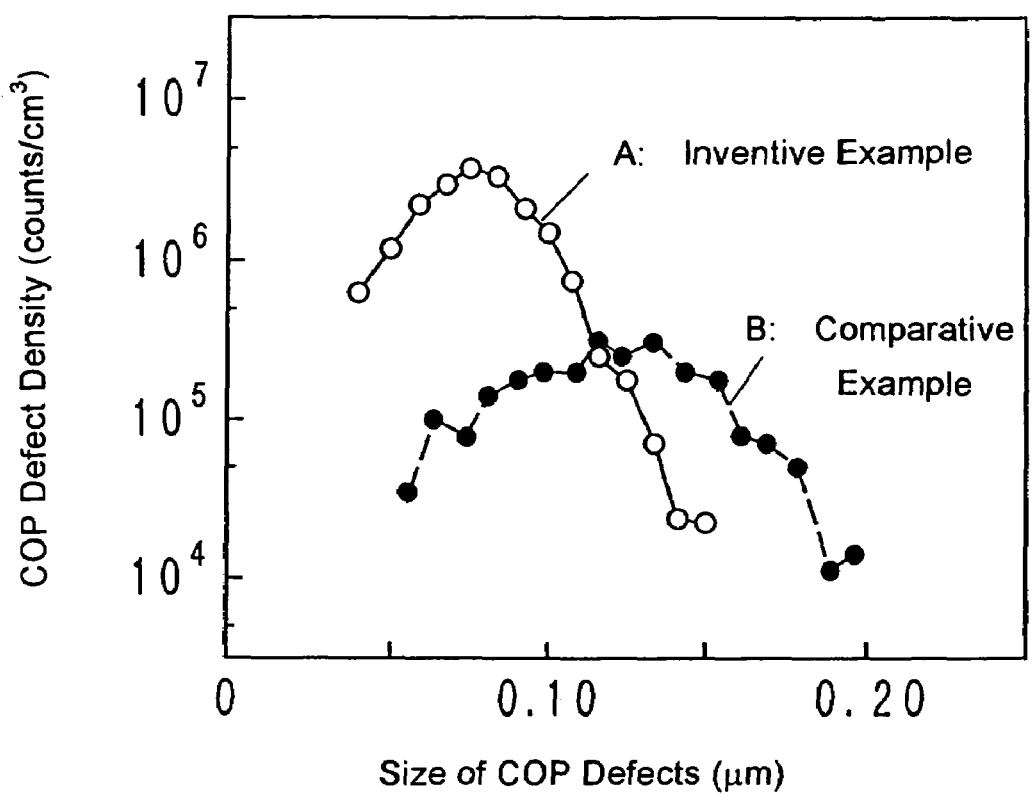
FIG. 2 is a diagram representing the relationship between the size of COP defects and the density of the defects as for an inventive and comparative examples.

FIG. 2 is a diagram showing the difference between an inventive example and comparative example regarding the relationship between the size of the COP defects and the density thereof. In the comparative example (B), the temperature gradient ratio Gc/Ge is 1.2 just after solidification in the growth process and nitrogen is not doped.

In the comparative example (B), the size of defects in the highest frequency of occurrence is 0.13 μm, and there exist several defects having a size of more than 0.2 μm. After subjected to the annealing process, no defects are found on the uppermost surface layer, but there remains COP defects just below the surface layer, thereby making it impossible to form a layer completely free from defects.

On the other hand, in the inventive example (A) in FIG. 2, the nitrogen concentration is $0.72 \times 10^{14}$ atoms/cm$^3$ and the temperature gradient ratio Gc/Ge at a temperature range between 1370° C. and 1310° C. is 1.12.

In the inventive example (A), the size of defects in the highest frequency of occurrence is 0.73 μm, and there exist no defects having a size of more than 0.2 μm. After subjected to the annealing process, a layer free from COP defects having a depth of more than 7 μm can be obtained.

The density of oxygen precipitates, i.e., BMDs was determined by the following procedures: A wafer was subjected to an oxygen precipitate evaluation heat treatment at 1000° C. in a dry oxygen atmosphere for 16 hours, and then cleaved into two pieces. Thereafter, the cleaved surface was wright etched to remove a 2 μm thickness layer from the surface. The defect density was then determined from the density of etch pits observed with an optical microscope. It was found that the density of oxygen precipitates formed inside the wafer after subjected to the oxygen precipitate evaluation heat treatment was $1 \times 10^4$ counts/cm$^2$ or more ($5 \times 10^7$ counts/cm$^3$ or more), and that the ratio of the maximum to the minimum of the oxygen precipitate density in the radial direction of the wafer was 3 or less.

When the density of oxygen precipitates formed in the wafer becomes less than $1 \times 10^4$ counts/cm$^2$, the gettering effect on impurity atoms as for devices formed on active regions of the surface tends to be insufficient. Thus, it is conceivable that the density of $1 \times 10^4$ counts/cm$^2$ or more is preferable.

In the case when the ratio of the maximum to the minimum BMD density in the radial direction of the wafer is more than 3, the variation of the gettering effect within the wafer surface becomes larger. An increased nonuniformity of the BMD density distribution could cause a possible warp of the wafer during the wafer process. Accordingly, it is necessary to retain the ratio of the maximum to the minimum of the BMD density within a value less than 3.

Figure 3:
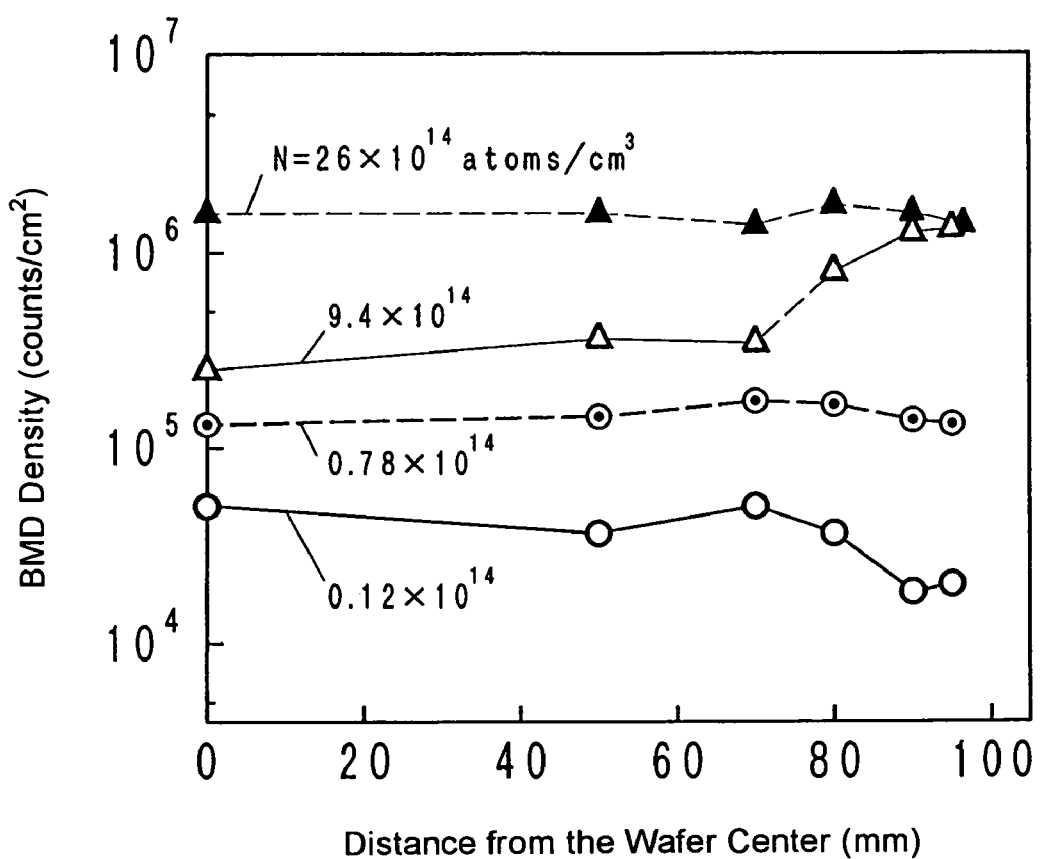
FIG. 3 is a diagram representing the relationship between the BMD density and the position on the wafer surface at a varied nitrogen concentration.

FIG. 3 shows that a positional change in the BMD density on the wafer surface depends on the nitrogen concentration. In FIG. 3, it is exemplified that the density of BMDs, i.e., oxygen precipitates in the wafer was experimentally determined for each of the single crystals which were grown varying the concentration of doped nitrogen under the condition that the temperature gradient ratio Gc/Ge is 1.0 in a temperature range between 1370° C. and 1310° C.

In examples shown in FIG. 3, the ratio of the maximum to the minimum of the BMD density is 3 or less at a nitrogen concentration of either $0.12 \times 10^{14}$ atoms/cm$^3$ or $0.78 \times 10^{14}$ atoms/cm$^3$, and the ratio is more than 5 at a nitrogen concentration of $9.4 \times 10^{14}$ atoms/cm$^3$. At an increased nitrogen concentration such as $26 \times 10^{14}$ atoms/cm$^3$, the homogeneity in the defect distribution within the wafer surface is good. However, such a high nitrogen concentration can be realized only at restricted area in the single crystal.

FIG. 3 is a diagram showing that a positional change in the BMD density on the wafer surface depends on the nitrogen concentration.

The annealing process for forming a layer free from COP defects on the surface of a wafer is conventionally performed such that a wafer is heated at 1100° C.-1250° C. for one to four hours in an atmosphere containing hydrogen gas, argon gas, helium gas or a mixed gas thereof. Under the above conditions, a defect free layer can be formed at a depth of 5 μm or more from the wafer surface if a wafer in the above-mentioned COP defect state is used.

In the recent technology for the fine fabrication of integrated circuits, the size of a circuit component itself is approximately close to the size of COP defects. Nevertheless, the integrated circuit formed in an active region on the wafer surface is positioned within a depth of 5 μm from the wafer surface. Accordingly, the effect of the defects can be avoided, if the layer free from COP defects has a depth of 5 μm or more from the surface.

A sufficient number of BMDs is formed at the above-mentioned temperature range, if a wafer is prepared at such an above-mentioned nitrogen concentration and at an oxygen precipitate density of $1 \times 10^4$ counts/cm$^2$ or more after an oxygen precipitate evaluation heat treatment.

The temperature range of 1100° C.-1250° C. is the same as the temperature range normally used for an epitaxial growth. If the above-mentioned wafer is used as a base material, an excellent epitaxial wafer having a perfect and uniform expitaxial layer and providing an efficient gettering effect can be obtained. A conventional method for forming such an epitaxial layer can be used, and therefore no specific restriction is given as for these conditions.

In the method for manufacturing a single crystal as a base material from which the above-mentioned wafer, i.e., the annealed wafer or the epitaxial wafer can be obtained, a silicon single crystal is grown, using the Czochralski method, under the following conditions that, when the averaged temperature gradient in the axial direction corresponding to the pulling direction is expressed by Gc (° C./mm) for the center of the single crystal and by Ge (° C./mm) for the outer periphery of the single crystal at a temperature range of 1370° C.-1310° C., the temperature gradient ratio Gc/Ge is set 1.0-1.5, and the cooling period from 1200° C. to 1000° C. is within 50 min, and the cooling period from 1030° C. to 920° C. is within 30 min.

The above single crystal growth condition, i.e., the temperature gradient ratio Gc/Ge being set 1.0-1.5 at a temperature range from 1370° C. to 1310° C., enhances the uniformity in the distribution within the wafer for both COPs and BMDs.

If the temperature gradient ratio Gc/Ge is less than 1.0 at the above temperature range, the generation of COP defects having a size of more than 0.2 μm can hardly be suppressed, and the ratio of the maximum to the minimum of the BMD density can hardly be reduced in a value of 3 or less.

In other words, the temperature gradient ratio Gc/Ge of less than 1.0 causes the potential region of OSF occurrence to occasionally occur in the outer periphery of the wafer even without doping nitrogen, thereby deteriorating the uniformity in the defect distribution on the wafer surface for both COPs and BMDs. When, however, the temperature gradient ratio becomes more than 1.5, the stress resulting from the cooling increases and therefore the fracture of the single crystal can take place.

In the single crystal growth under the above conditions, the cooling period from 1200° C. to 1000° C. is within 50 min, and the cooling period from 1030° C. to 920° C. is within 30 min. This is due to the fact that, when the pass time in cooling from 1200° C. to 1000° C. becomes more than 50 min, the size of COP defects in the highest frequency of occurrence increases.

Moreover, this is due to the fact that, when the pass time in cooling from 1030° C. to 920° C. becomes more than 30 min, the uniformity in the BMD density distribution deteriorates, and the ratio of the maximum to the minimum of the BMD density tends to be more than 3. A shorter pass time through the two temperature ranges provides a more prominent effect. However, the pass time is inevitably limited by both the speed of pulling the single crystal and the cooling method.

at 650° C. for 30 min in a nitrogen gas atmosphere, and then wafers were produced from the test pieces. The following characteristics were determined by measurements for each of the test specimens: The size and distribution of COP defects; the BMD density distribution; and the thickness of the defect free layer and the BMD density of the test pieces which were further annealed at 1200° C. for one hour in an argon atmosphere.

The measurement of COP defects was performed, using an OPP device (Oxygen Precipitate Profiler, manufactured by Accent Optical Technologies Co., Ltd.).

In order to determine the BMD density distribution, a test piece of each wafer was heated at 1000° C. for 16 hours in a dry oxygen atmosphere, and then cleaved into two pieces. Thereafter, the cleavage section was wright etched to remove a 2 μm thickness layer from the surface, and then the density of etch pits was measured every 10 mm on the etched surface, utilizing an optical microscope. The results of measurement are also listed in Table 1.

TABLE 1

| Test No. | Oxygen Concentration ($10^{17}$ atoms/cm$^3$) | Nitrogen Concentration ($10^{14}$ atoms/cm$^3$) | V/Gc From Melting Point To 1350° C. | Gc/Ge From 1370° C. To 1310° C. | Pass Time (min) From 1200° C. To 1000° C. |
|---|---|---|---|---|---|
| 1 | 13.4 | 0.87 | 0.27 | 1.00 | *56 |
| 2 | 14.0 | *7.80 | 0.27 | 1.00 | *56 |
| 3 | 11.1 | 0.28 | 0.26 | 1.12 | 35 |
| 4 | 11.8 | 0.72 | 0.26 | 1.12 | 35 |
| 5 | 12.4 | 0.83 | 0.25 | 1.08 | 41 |
| 6 | 13.6 | 0.62 | 0.22 | 1.00 | 45 |

| Test No. | Pass Time (min) From 1030° C. To 920° C. | COP Defect Size Highest Frequency (μm) | COP Defect Size Maximum (μm) | BMD Desnity Average ($10^4$ counts/cm$^2$) | BMD Desnity Max./Min. | Remarks |
|---|---|---|---|---|---|---|
| 1 | *40 | *0.12 | *0.22 | 16.2 | 1.4 | Comparative Example |
| 2 | *40 | 0.09 | 0.19 | 23.2 | *3.1 | Comparative Example |
| 3 | 23 | 0.07 | 0.16 | 6.0 | 2.2 | Inventive Example |
| 4 | 23 | 0.07 | 0.15 | 25.0 | 1.7 | Inventive Example |
| 5 | 27 | 0.07 | 0.16 | 25.0 | 2.4 | Inventive Example |
| 6 | 30 | 0.08 | 0.15 | 37.0 | 2.4 | Inventive Example |

Mark *shows the outside of the range defined by the invention.

EXAMPLES

Utilizing a Czochralski furnace capable of varying the cooling conditions in the hot zone, a p-type silicon single crystal having a diameter of 200 mm, a resistivity of 10 Ωcm and an oxygen concentration of approximately 14×10$^{17}$ atoms/cm$^3$ was grown, varying the following parameters in the growth conditions: the nitrogen doping concentration; the temperature gradient ratio Gc/Ge at a temperature range from 1370° C.-1310° C.; the pass time from 1200° C. to 1000° C.; and the pass time from 1030° C. to 920° C. The conditions for growing a single crystal in trial are listed in Table 1.

Each grown single crystal was sliced into disk-shaped test pieces. These test pieces were subjected to a heat treatment Test Nos. 1 and 2 in Table 1 were grown in the temperature gradient ratio Gc/Ge=1.00 at a temperature range from 1370° C. to 1310° C. However, both the pass time from 1200° C. to 1000° C. and the pass time from 1030° C. to 920° C. were outside of the ranges defined by the present invention.

As for Test No. 1, it is found that the size of COP defects in the highest frequency of occurrence is as large as 0.12 μm and the maximum size of the defects is more than 0.2 μm. This is probably due to the fact that the doped nitrogen concentration is too small. On the other hand, as for Test No. 2 having a large doped nitrogen concentration, the size of COP defects is small, but the ratio of the maximum to the minimum of the BMD defects is more than 3.

On the contrary, as for Test Nos. 3-6, in which the above growth conditions are satisfied within the ranges defined by the present invention, it is found that the size of COP defects is small and the ratio of the maximum to the minimum of the BMD distribution density is 3 or less.

The wafers thus prepared as a base material were annealed at 1200° C. for one hour in an argon atmosphere to produce an annealed wafer, and then, as for the wafers, the depth of the layer free from COP defects was evaluated. The annealed wafer was polished, removing a layer having a predetermined thickness from the surface to form a 25 nm thickness gate oxide layer after heat treatment. Then, a 400 nm polysilicon layer was deposited onto the wafer, using the low-pressure chemical vapor deposition method, and then doped with phosphor. Thereafter, applying a resist coating, masking, developing and etching processes to the wafer, gate electrodes having an area of 8 mm$^2$ were formed on the surface of the wafer.

After subjected to these treatments, the wafer was evaluated regarding the dielectric strength of the oxide layer, using the current injection TDDB (Time Dependent Dielectric Breakdown) method. A chip providing no dielectric breakdown at an injected charge amount of 0.1 C/cm$^2$ was regarded as a good-quality article, and the rate of yielding good-quality articles was 95% or more. The depth from the surface to the substrate (specular polishing amount) was regarded as a layer free from COP defects. The results of evaluation are listed in Table 2.

Epitaxial wafers were prepared by growing a 2 μm thickness epitaxial layer on the surface of the base materials, Test Nos. 1, 4, 5 and 6 at 1125° C. in a hydrogen carrier gas atmosphere containing SiHCl$_3$. Defects in the epitaxial layer were detected by scanning the surface thereof, using a surface inspection device (KLA-Tencor Surfscan SP-1). As for the BMD defect density, a method similar to that in the above was employed: The wafer was cleaved into two pieces and the cleavage section was wright etched to remove a 2 μm thickness layer from the surface, and then the etched surface was observed to determine the defect density. These results are also listed in Table 2.

From the results in Table 2, it can be ascertained that the annealed wafer produced from, e.g., Test No. 1, has no sufficient thickness of the layer free from COP defects and the annealed wafer produced from, e.g., Test No. 2, has a large value in the ratio of the maximum to the minimum of the BMD distribution density, and shows an uneven distribution. On the contrary, the annealed wafers produced from Test Nos. 3-6 have a defect free layer thickness of more than 5 μm, and have a value of less than 3 in the ratio of the maximum to the minimum of the BMD distribution density, along with an excellent uniformity.

In conjunction with the above, the epitaxial wafer produced from, e.g., Test No. 1, includes not only numerous defects, but also non-uniformity in the BMD distribution density. However, epitaxial wafers produced from Test Nos. 4-6 provide a satisfactory uniformity.

As described above, the annealed wafers according to the present invention have a sufficiently thick layer free from COP defects on the surface as well as BMDs formed in a sufficiently uniform distribution. The epitaxial wafers forming an epitaxial layer on the surface of the above-mentioned wafer have a reduced number of defects and sufficiently uniform BMD distribution. The wafers according to the present invention ensure reducing the rate of defective goods as for the devices formed on the surface of the wafer, thereby enabling the device productivity to be greatly enhanced.

While preferred embodiments have been shown and described, various modifications and substitutions may be made without departing from the spirit and scope of the invention. Accordingly, it is to be understood that the present invention has been described by way of example, and not by limitation.

What is claimed is:

1. A silicon annealed wafer, on the surface of which a COP defect free layer having a thickness of 5 μm or more is formed by annealing a base material wafer, wherein said base material wafer includes:

a COP defect region of a single crystal containing nitrogen at a concentration of less than 1×10$^{14}$ atoms/cm$^3$, wherein said COP defect has a size of 0.1 μm or less in the highest frequency of occurrence and there exist no COP defects having a size of more than 0.2 μm;

TABLE 2

| | | After Annealed | | | After forming expitaxial layer | | |
| | | Defect free layer | BMD Density | | | BMD Density | | |
| Test No. | thickness (μm) | Average (10$^4$ counts/cm$^2$) | Max./Min. | Defect Density (counts/wafer) | Average (10$^4$ counts/cm$^2$) | Max./Min. | Remarks |
|---|---|---|---|---|---|---|---|
| 1 | *2.1 | 28.5 | 2.8 | 24 | 26.4 | *88 | Comparative Example |
| 2 | 6.8 | 35.0 | *5.9 | — | — | — | Comparative Example |
| 3 | 6.4 | 32.9 | 1.4 | — | — | — | Inventive Example |
| 4 | 8.0 | 24.7 | 1.4 | 3 | 5.2 | 2.2 | Inventive Example |
| 5 | 8.5 | 37.5 | 1.6 | 4 | 21.7 | 1.2 | Inventive Example |
| 6 | 7.8 | 49.3 | 2.8 | 9 | 14.5 | 2.1 | Inventive Example |

Mark *shows the outside of the range defined by the invention.
Symbol "—" shows no treatment.

oxygen precipitates formed at a density of $1\times10^4$ counts/cm$^2$ or more when said base material wafer is subjected to a oxygen precipitate evaluation heat treatment; wherein the ratio of the maximum to the minimum of BMD (oxygen precipitate) density is 3 or less in the radial direction of said base material wafer.

2. A silicon annealed wafer according to claim 1, wherein the oxygen concentration of said base material wafer is $11\times10^{17}$-$17\times10^{17}$ atoms/cm$^3$ (ASTM F-121, 1979).

3. A silicon annealed wafer according to claim 1, wherein said COP defect occurrence region extends over an 80% or more surface area of said base material wafer in the radial direction.

4. A silicon annealed wafer according to claim 1, wherein the annealing process is performed at 11000° C. 1250° C. for 1-4 hours in a hydrogen gas, argon gas, helium gas or a mixed gas thereof.

5. A silicon epitaxial wafer produced by forming an epitaxial layer on the surface of a base material wafer, wherein said base material wafer includes:

a COP defect occurrence region of a single crystal containing nitrogen at a concentration of less than $1\times10^{14}$ atoms/cm$^3$, wherein said COP defect has a size of 0.1 μm or less in the highest frequency of occurrence and there exist no COP defects having a size of more than 0.2 μm;

oxygen precipitates formed at a density of $1\times10^{14}$ counts/cm$^2$ by applying an oxygen precipitate evaluation heat treatment; wherein the ratio of the maximum to the minimum of BMD (oxygen precipitate) density is 3 or less in the radial direction of said base material wafer.

6. A silicon epitaxial wafer according to claim 5, wherein the oxygen concentration of said base material wafer is $11\times10^{17}$-$17\times10^{17}$ atoms/cm$^3$ (ASTM F-121, 1979).

7. A silicon epitaxial wafer according to claim 5, wherein said COP defect occurrence region extends over an 80% or more surface area of said base material wafer in the radial direction.

* * * * *

UNITED STATES PATENT AND TRADEMARK OFFICE
CERTIFICATE OF CORRECTION

PATENT NO. : 7,273,647 B2
APPLICATION NO. : 10/809712
DATED : September 25, 2007
INVENTOR(S) : Nishikawa et al.

It is certified that error appears in the above-identified patent and that said Letters Patent is hereby corrected as shown below:

Title Page, item [56] Under References Cited, Non-Patent Publication should be included: K. Nakai; "NITROGEN AND CARBON EFFECT ON THE FORMULATION OF GROWN-IN DEFECTS AND OXYGEN PRECIPITATION BEHAVIOR"; the 52nd Conference of the Japanese Association for Crystal Growth, Bulk Growth Section Meeting; February 8, 2000, pgs. 6-9

Column 15, line 17:
"the annealing process is performed at 11000°C - 1250°C for"
should read:
--the annealing process is performed at 1100°C - 1250°C for--

Column 16, line 8:
"oxygen precipitates formed at a density of $1 \times 10^{14}$ counts/"
should read:
--oxygen precipitates formed at a density of $1 \times 10^{4}$ counts/--

Signed and Sealed this

Seventeenth Day of June, 2008

JON W. DUDAS
*Director of the United States Patent and Trademark Office*